(12) United States Patent
Stolz et al.

(10) Patent No.: US 6,226,184 B1
(45) Date of Patent: May 1, 2001

(54) ENCLOSURE MOUNTED HEAT SINK

(75) Inventors: Howard W. Stolz, Soquel; Jay K. Osborn, Ferndale; Daniel B. Hruska, San Carlos, all of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/427,126

(22) Filed: Oct. 22, 1999

(51) Int. Cl.[7] .................................................. H05K 7/20
(52) U.S. Cl. ...................... 361/704; 361/700; 361/702; 174/15.1; 257/706; 257/707; 165/80.3; 165/165
(58) Field of Search ................... 361/687–690, 361/700–712, 713, 719, 721–723, 727, 683, 684, 735; 257/706–727, 685, 692; 165/80.3, 80.4, 185, 104.32, 104.33, 80.2, 165; 174/52.1, 16.3, 35 MS, 16 HS, 15.2, 15.1

(56) References Cited

U.S. PATENT DOCUMENTS

| | | | |
|---|---|---|---|
| 3,896,544 | * | 7/1975 | Fosnough ................................ 29/588 |
| 4,415,025 | * | 11/1983 | Horvath ................................ 165/185 |
| 4,442,450 | * | 4/1984 | Lipschutz et al. ...................... 357/81 |
| 4,602,314 | * | 7/1986 | Broadbent ............................. 361/386 |
| 4,621,304 | * | 11/1986 | Oogaki et al. ......................... 361/386 |
| 4,756,081 | * | 7/1988 | Penn ........................................ 29/832 |
| 5,247,425 | * | 9/1993 | Takahasi ................................ 361/717 |
| 5,424,913 | * | 6/1995 | Swindler ............................... 361/687 |
| 5,430,609 | * | 7/1995 | Kikinis .................................. 361/711 |
| 5,461,540 | * | 10/1995 | Lee ........................................ 361/687 |
| 5,650,662 | * | 7/1997 | Edwards et al. ...................... 257/700 |
| 5,805,417 | * | 9/1998 | Nakagawa et al. ................... 361/687 |
| 5,835,348 | * | 11/1998 | Ishida ................................... 361/699 |
| 5,946,193 | * | 8/1999 | Hendrix et al. ...................... 361/704 |
| 5,969,940 | * | 10/1999 | Sano et al. ........................... 361/687 |
| 6,002,587 | * | 12/1999 | Shusa et al. .......................... 361/704 |
| 6,011,690 | * | 1/2000 | Hudges et al. ....................... 361/704 |
| 6,025,991 | * | 2/2000 | Saito ..................................... 361/704 |
| 6,044,899 | * | 4/2000 | Landley et al. .................. 165/104.33 |

FOREIGN PATENT DOCUMENTS

| | | | |
|---|---|---|---|
| 402170494A | * | 7/1990 | (JP) ............................. H05K/07/20 |
| 406069389A | * | 3/1994 | (JP) ............................. H01L/23/40 |
| 408008567A | * | 1/1996 | (JP) ............................. H05K/07/20 |
| 408298390A | * | 11/1996 | (JP) ............................. H05K/07/20 |
| 410173371A | * | 6/1998 | (JP) ............................. H05K/07/20 |

* cited by examiner

Primary Examiner—Leo P. Picard
Assistant Examiner—Michael Datskovsky
(74) Attorney, Agent, or Firm—Conley, Rose & Tayon, P.C.

(57) ABSTRACT

A heat sink for a heat generating component of a computer system, such as a central processing unit (CPU), attaches to the computer system enclosure. The heat sink may be pressed against the component to establish thermal contact with the component. Because the heat sink attaches to the computer system enclosure and not the component, the component socket, or a circuit board; the heat sink may be unusually shaped and large, while still allowing easy access to the components mounted within the computer system enclosure. Removing the enclosure panel on which the sink is attached may allow easy access to the components within the computer enclosure. The heat sink may be particularly useful in computer systems that use only natural convection cooling.

28 Claims, 4 Drawing Sheets

ENCLOSURE MOUNTED HEAT SINK

BACKGROUND OF THE INVENTION

1. Field of the Invention

This invention generally relates to a heat sink for a computer system, and more particularly to a heat sink system for a computer wherein the heat sink attaches to the computer system enclosure.

2. Description of the Related Art

Computer systems such as personal computers, workstations, and portable computers, typically include components housed within an enclosure. Some components, such as central processing units (CPUs) and memory chips, typically mount on circuit boards within the enclosure. Other components, such as circuit boards and disk drives, typically mount to a chassis of the computer system.

Some computer components, such as CPUs, generate heat during use. A component can only function properly when the temperature of the component is at or below a maximum operating temperature. Often, the package of a component is too small to allow enough heat transfer from the package to keep the component at or below the maximum operating temperature using only natural convection. Such components require additional cooling. If the temperature of a computer component exceeds the maximum operating temperature of the component, or if the temperature within the computer enclosure exceeds a maximum operating temperature, a reduction of computer performance may occur. Eventually, the components of the computer system can be permanently damaged or destroyed if the computer components or the computer system operate at too hot a temperature.

Trends in the computer industry include producing faster and smaller computer systems. Fast computer processors have been produced, but the amount of heat generated during use by the fast processors has also increased. Combining computer components that generate heat into a small computer system enclosure leads to problems of removing the heat from the computer components and from the computer system enclosure.

A fan or fans may be used to provide forced convection cooling of a computer component or a computer system. Adding a fan to a computer system may not be desirable. Fans can be noisy, expensive, and a fan is often the shortest-lived component of a computer system. Having a fan in a computer system may lower the reliability of the entire computer system. If the fan fails, other system components may be permanently damaged or destroyed. In some systems, the addition of a fan or fans to provide component cooling may be a necessity. In other systems, the use of heat sinks and natural convection may provide sufficient cooling.

One type of heat sink provides a thermal connection between a component being cooled and a large convection cooled surface area. Typically, such heat sinks mount directly to a component, to the component's socket on a circuit board, or to the circuit board. Practical size and weight limits exist for heat sinks that mount on the component, on the component socket, or on the circuit board. For example, a tall heat sink mounted directly on the component may not be practical. Jostling a tall heat sink mounted on a component may damage the connection between the component and the circuit board. Mishandling a tall heat sink mounted on the component may knock the heat sink off of the component. Socket and circuit board mounted heat sinks may greatly increase the assembly cost of a computer system.

Space limitations within a computer system enclosure may limit the size of heat sinks available for use in the computer system. If a heat sink is too large, it may overlap areas of the computer that require service access. Such areas include, but are not limited to EPROM, RAM modules, and test points.

A relatively inexpensive way of attaching a heat sink to a component is to purchase the computer device with the heat sink pre-attached to the device by the manufacturer. Typically, the device with the pre-attached heat sink is loaded onto a circuit board by automatic placement equipment. A disadvantage of buying a component with a pre-attached heat sink is that the component and heat sink combination might be too large to be handled by the automatic placement equipment.

SUMMARY OF THE INVENTION

An enclosure mounted heat sink for a computer system component mounts on the computer system enclosure. The heat sink may press against the computer component to establish thermal contact between the heat sink and the computer component. Attaching the heat sink to a panel of the computer enclosure may minimize size, mass and placement issues associated with mounting a heat sink on a component, a component socket, or a circuit board. Attaching the heat sink to an enclosure panel may improve the ruggedness of the computer system by moving the mass of a heat sink off of fragile system components.

The enclosure mounted heat sink may directly contact the computer component to be cooled, or the enclosure mounted heat sink may contact an interface part attached to the component. The interface part may be of a size that automatic placement equipment can easily handle during assembly of the computer system. The interface part may be a heat sink that is directly mounted to the computer component. In such a case, the interface heat sink may be smaller than a heat sink sized to meet the entire heat transfer needs of the computer component. Reducing the size of a heat sink that directly mounts to a component of a computer system, the component socket or a circuit board may make the computer system more rugged and easier to assemble.

An enclosure mounted heat sink allows easy access to a circuit board during assembly of a computer system. The enclosure mounted heat sink also allows easy access to an installed circuit board during maintenance, repair, or removal of the circuit board. To provide access to the circuit board, the panel upon which the heat sink is mounted is removed from the enclosure. Removing the panel removes the heat sink from the system and provides access to the circuit board without interference from the heat sink.

The enclosure mounted heat sink may be larger and more irregularly shaped than a heat sink that mounts to the component, to a component socket, or to a circuit board. A larger, more irregularly shaped heat sink may provide more cooling surface area than a conventional heat sink. The larger, more irregularly shaped heat sink would still be able to accommodate assembly tolerances. The enclosure mounted heat sink may overlap areas of the circuit board that require service access. When service access is required, the panel upon which the heat sink is mounted may be removed to allow access to the interior of the computer system enclosure without interference from the heat sink.

Figure 1:
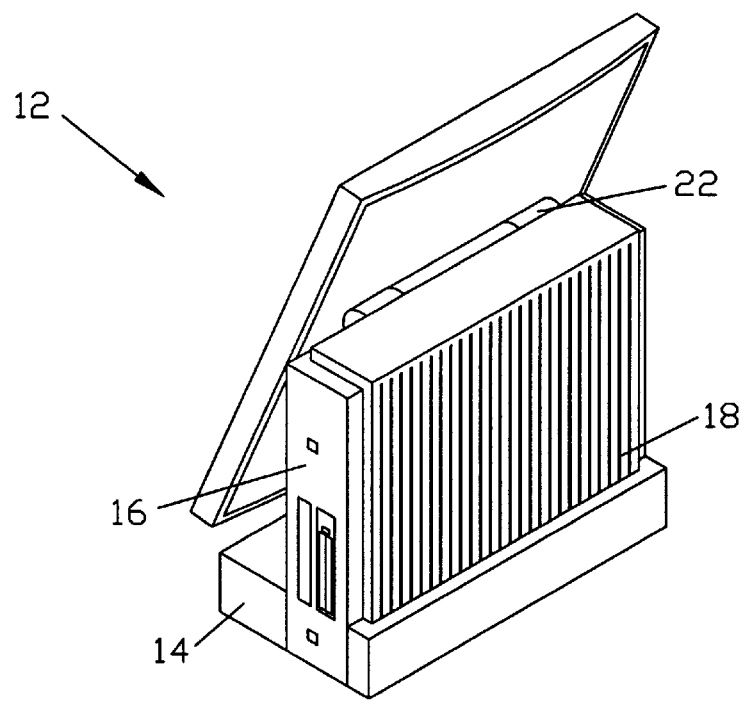
FIG. 1 is a perspective view of the back of a workstation.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but to the contrary, the intention is to cover all modifications, equivalents and alternatives falling within the spirit and scope of the present invention as defined by the appended claims.

DETAILED DESCRIPTION OF THE PREFERRED EMBODIMENTS

Referring to the drawings, an enclosure mounted heat sink for cooling a computer component is designated generally as 10. An enclosure mounted heat sink 10 attaches to a panel of a computer system enclosure. An enclosure mounted heat sink thermally contacts the computer component that requires additional cooling. A component that may require additional cooling includes, but is not limited to, a central processing unit (CPU), a power converter, a disk drive, or other system device that generates heat during operation. For purposes of illustration only, the enclosure mounted heat sink 10 will be described as being thermally connected to a CPU and a CPU heat sink within a workstation.

Figure 2:
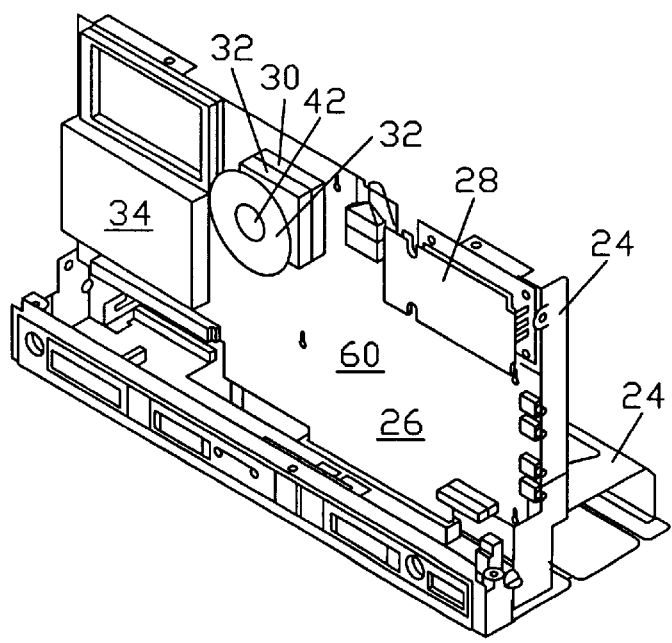
FIG. 2 is a perspective view of the chassis of a workstation.

FIG. 1 shows a perspective view of a vertically oriented workstation 12. The workstation 12 may have base panel 14, side panel 16, back panel 18, pivotal display 20, and pivot 22. FIG. 2 shows a perspective view of chassis 24 of a workstation 12. Circuit board 26 and power converter 28 may mount to the chassis 24. CPU 30, CPU heat sink 32, and Personal Computer Memory Card International Association (PCMCIA) connector 34 may mount to the circuit board 26. The CPU 30, the CPU heat sink 32, and the enclosure mounted heat sink (the enclosure mounted heat sink not shown in FIG. 2) may be positioned near the top of the circuit board 26 so that heat generated by the CPU and dissipated by the heat sinks does not need to rise far to pass through the vented exterior of the enclosure. Locating the CPU 30, and the heat sinks 32, 10 near the top of the circuit board 26 may also help to prevent the CPU and the heat sinks from heating other computer components within the enclosure before the heat is dissipated out of the enclosure. The CPU 30, and the heat sinks 32, 10 may be located at positions other than near the top of the circuit board to meet particular system cooling and spacing requirements.

Figure 3:
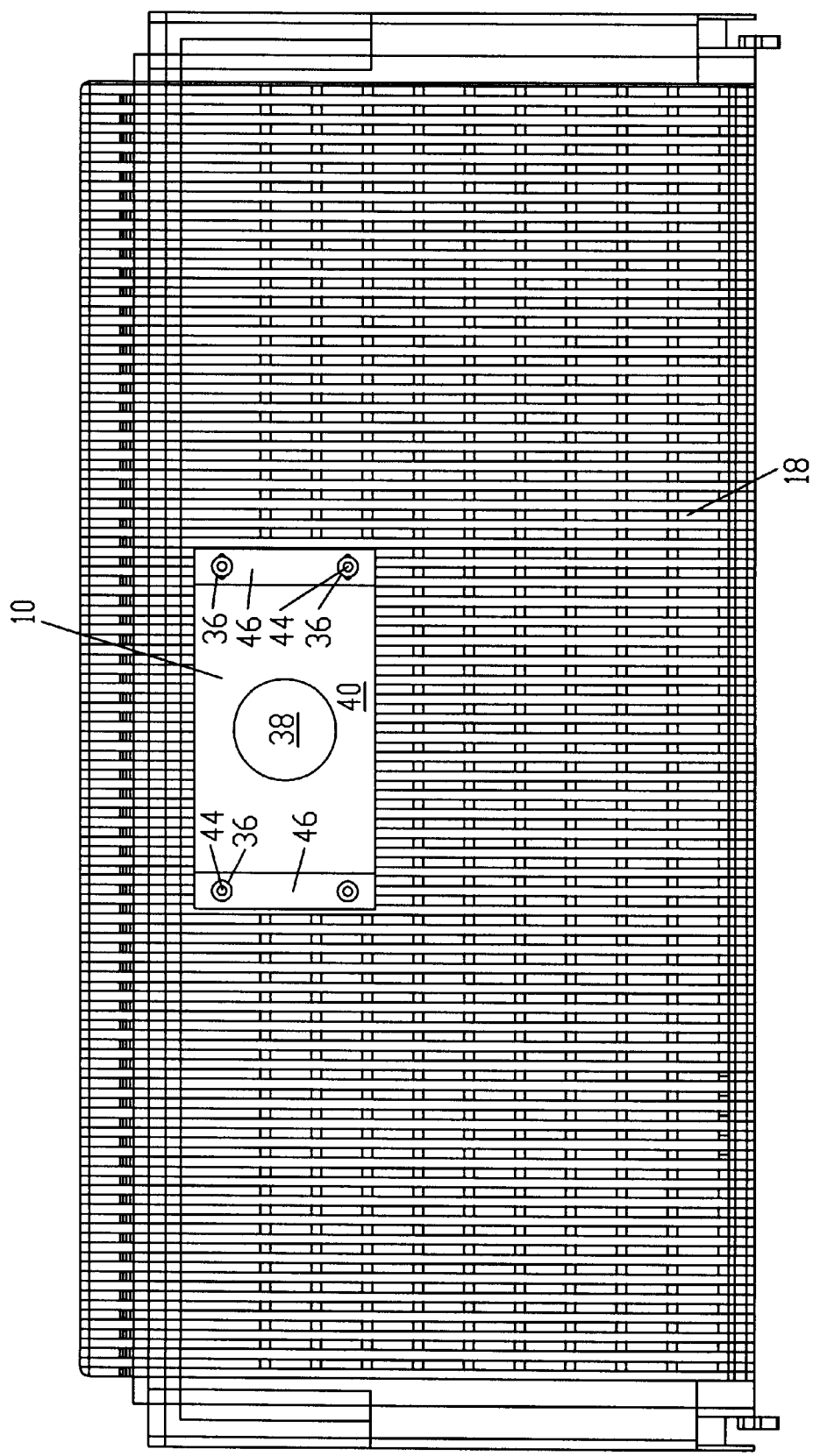
FIG. 3 is an elevational view of a enclosure mounted heat sink attached to a back panel of a workstation.

FIG. 3 shows an enclosure mounted heat sink 10 attached to the inside of the back panel 18 by fasteners 36. The enclosure mounted heat sink 10 may have thermal interface pad 38 attached to spring section 40. The thermal interface pad 38 provides a high thermal conductivity connection between the enclosure mounted heat sink 10 and contact surface 42 of the component being cooled. The thermal interface pad 38 may be compressible and moldable. The thermal interface pad 38 may conform to the exterior surface shape of the contact surface 42 to which the enclosure mounted heat sink 10 is thermally connected when the spring section 40 presses the thermal interface pad against the contact surface. Having a thermal interface pad 38 which conforms to the shape of the contact surface 42 may help to establish a good thermal connection between the enclosure mounted heat sink 10 and the contact surface 42. Alternately, the spring section 40 of the enclosure mounted heat sink 10 may directly contact the contact surface 42 of the component being cooled.

Figure 4:
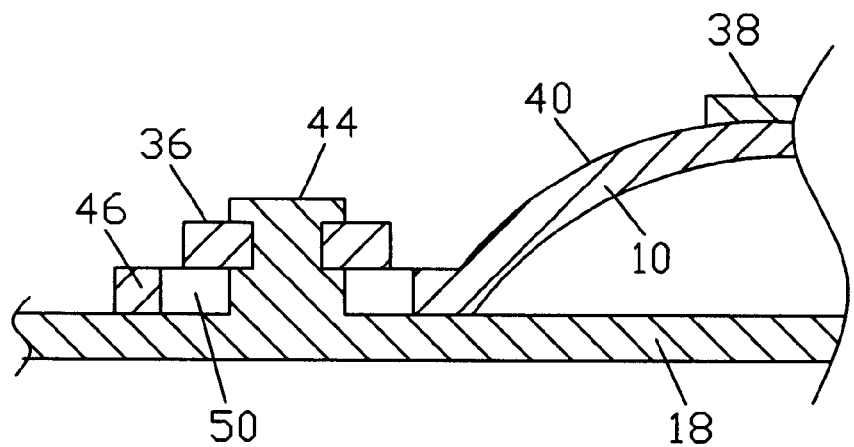
FIG. 4 is a partial cross sectional view of a back panel of a workstation with an attached enclosure mounted heat sink.

FIG. 4 shows a partial sectional view of the back panel 18 with an attached enclosure mounted heat sink 10. The enclosure mounted heat sink 10 may be attached to posts 44 extending from the surface of the panel 18 with the fasteners 36. The fasteners may be Tinnerman washers. Alternatively, other fastening systems, including, but not limited to rivets, nuts and bolts, glue, and welds may be used to attach the enclosure mounted heat sink 10 to the panel 18.

The enclosure mounted heat sink 10 may be secured to the panel 18 with fasteners 36 connected to the posts 44 placed through the holes 48 and the oblong holes 50. The oblong holes 50 may permit some axial movement of a portion of the heat sink 10 when the heat sink is pressed against a contact surface of the component being cooled. The axial movement of a portion of the heat sink 10 may help to establish good thermal contact between the enclosure mounted heat sink and the contact surface of the component being cooled. The axial movement of a portion of the heat sink 10 may prevent excessive pressure from being applied to the component being cooled by the heat sink.

Figure 5:
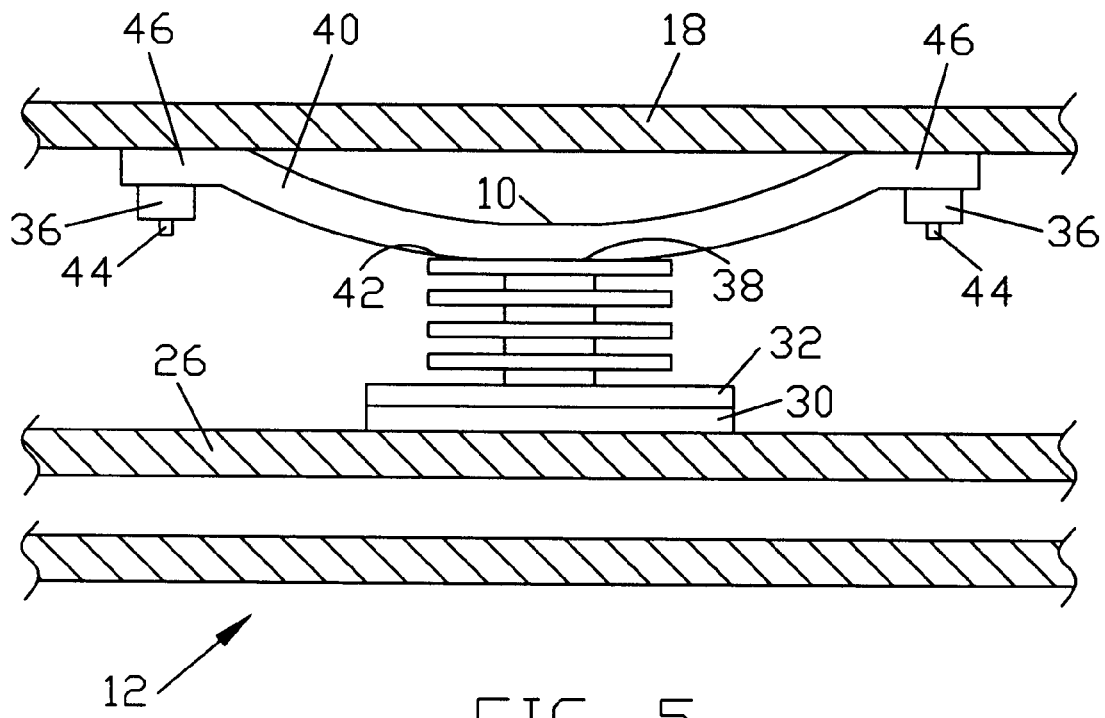
FIG. 5 is a partial cross sectional view of a workstation enclosure showing an enclosure mounted heat sink contacting a central processing unit heat sink.

FIG. 5 shows a cross-sectional view of a portion of an assembled workstation 12 with an attached enclosure mounted heat sink 10. The thermal interface pad 38 may contact upper surface 42 of the CPU heat sink 32. The CPU heat sink 32 may thermally contact CPU 30. Thermal contact between the CPU heat sink 32 and the enclosure mounted heat sink 10 may be maintained by pressure applied to the CPU heat sink by the enclosure mounted heat sink. The pressure applied to the CPU heat sink 32 is a result of force applied by the spring section of the enclosure mounted heat sink 10 against the CPU heat sink.

Figure 6:
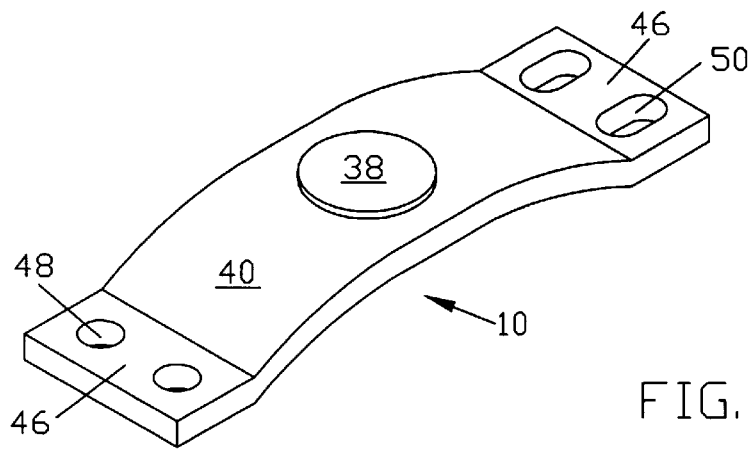
FIG. 6 is a perspective view of an enclosure mounted heat sink.

FIG. 6 shows a perspective view of an enclosure mounted heat sink 10. The enclosure mounted heat sink 10 may include thermal interface pad 38, spring section 40, base sections 46 with mounting holes 48 and oblong mounting holes 50. The thermal interface pad 38 may be located at the top of the spring section 40. The thermal interface pad 38 may have an upper surface area that is larger than the contact surface to which the enclosure mounted heat sink 10 is thermally connected. The spring section 40 and the bases 46 may act like a leaf spring when the enclosure mounted heat sink 10 is attached to the panel 18 and brought into thermal contact with the CPU heat sink 32.

The enclosure mounted heat sink 10 may be made of a high thermal conductivity metal such as aluminum, an aluminum alloy, copper, or a copper alloy. Beryllium copper may be used as a copper alloy to form a portion of the heat sink 10. Because the heat sink 10 mounts on the panel 18, and not the CPU 30, the CPU's socket, or the circuit board 26, the size of the heat sink may be large as compared to conventional heat sinks that attach to the CPU, the CPU's socket, or the circuit board. Also, the mass of the heat sink may be large as compared to the mass of conventional heat sinks that attach to the CPU, the CPU's socket, or the circuit board.

Figure 7:
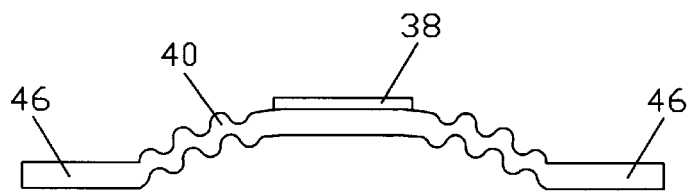
FIG. 7 is a side elevational view of an embodiment of an enclosure mounted heat sink having corrugations.
Figure 8:
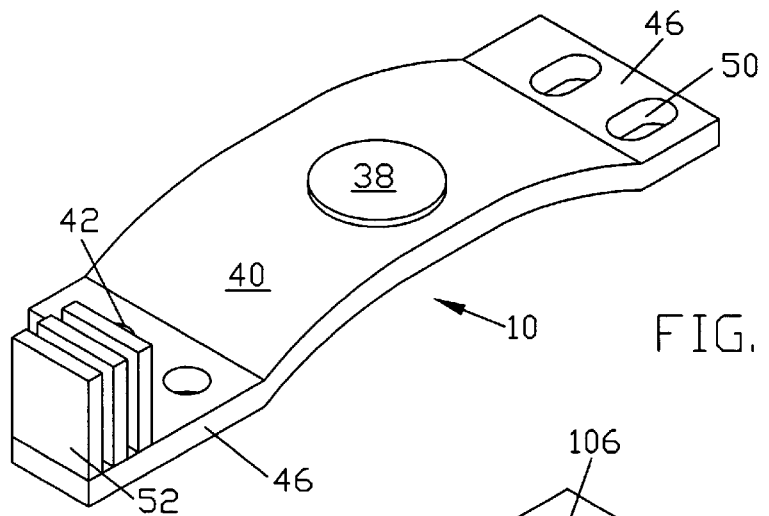
FIG. 8 is a perspective view of an embodiment of an enclosure mounted heat sink having fins.

FIG. 7 shows a side view of an alternate embodiment enclosure mounted heat sink 10 having corrugations. The corrugations may provide extra heat transfer area for the heat sink 10. FIG. 8 shows an alternate embodiment enclosure mounted heat sink 10 wherein a portion of the heat sink includes protruding fins 52. Also, a portion of the heat sink 10 shown in FIG. 8 has an irregular geometric configuration. A heat sink 10 may have an irregular geometric configuration so that the heat sink only contacts selected computer components within the computer system enclosure when the computer system is assembled. A geometric configuration for a heat sink 10 may be designed to meet specific computer system tolerance requirements.

In an operating computer system, the CPU generates heat. A portion of the heat generated by the CPU is transferred to the CPU heat sink 32. A portion of the heat transferred to the CPU heat sink 32 is transferred to the contact surface of the enclosure mounted heat sink 10. The enclosure mounted heat sink 10 transfers heat to the surroundings. The large surface area and shape of the enclosure mounted heat sink 10 may make the heat sink well suited for use in computer systems that use natural convection cooling. The enclosure mounted heat sink 10 may provide extended heat transfer area for a computer system so that a forced convection cooling system design may be avoided.

Figure 9:
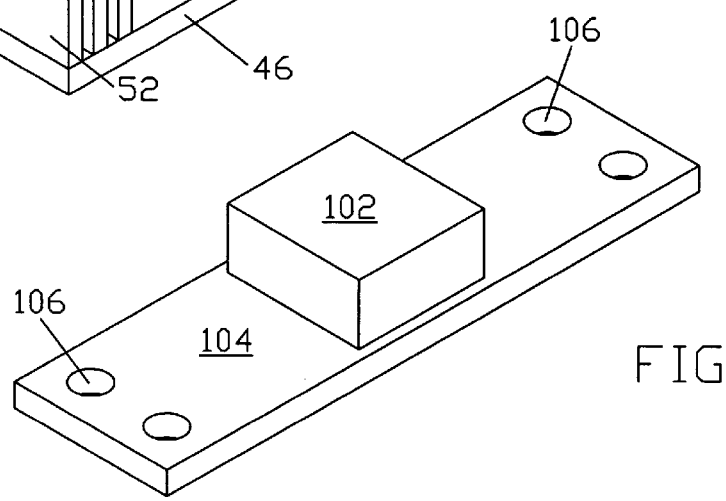
FIG. 9 is a perspective view of an embodiment of an enclosure mounted heat sink.

FIG. 9 shows an alternate embodiment of the enclosure mounted heat sink 10. The heat sink 10 comprises a thermally conductive pad 102. The pad 102 presses against an upper surface 42 of the component to be cooled. The pad 102 may be attached to rigid base 104 of the heat sink 10. Base 104 may be a made of a high conductivity material such as aluminum, an aluminum alloy, copper, or a copper alloy. The base may be attached to the panel 18 by fasteners 36 through holes 106. The base 104 shown in FIG. 9 is depicted as a flat slab, but the base could have any desired geometry. Also, the base 104 may be corrugated adjacent to the pad 102 to provide additional heat transfer surface area for the heat sink. Alternately, the base 104 may have fins protruding from an upper surface of the base adjacent to the pad to provide additional heat transfer surface area for the heat sink 10. Fasteners 36 may be any type of fastener capable of connecting the enclosure mounted heat sink 10 to the panel 18, including, but not limited to, screws, nuts and bolts, posts and washers, and rivets. Alternately, the heat sink 10 may be attached to the panel by glue or welds.

The pad 102 may be made of a compressible, flexible, conductive material; such as a flexible, conductive elastomer. The flexible nature of the pad 102 may allow the pad to adjust to assembly tolerances. The compressible nature of the pad may allow the pad to provide pressure between the base 104 and the contact surface 42 to enhance good thermal contact. The pad 102 should be thin to provide minimal thermal resistance; yet the pad should be able to take up assembly tolerances and provide sufficient pressure against the contact surface 42 to establish good thermal contact between the contact surface and the base 104.

Further modifications and alternative embodiments of various aspects of the invention will be apparent to those skilled in the art in view of this description. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A heat sink system comprising:
 a component within an enclosure, and
 a heat sink coupled to the enclosure by a first fastener at a first mount and by a second fastener at a second mount, wherein a portion of the heat sink between the first fastener and the second fastener is configured to thermally couple to the component, and wherein the first fastener and heat sink are configured to allow a portion of the heat sink to move relative to the enclosure when the heat sink is thermally connected to the component to avoid application of excessive force on the component by the heat sink;
 wherein heat transfers from the component to the heat sink during use and wherein heat transfers from the heat sink to surroundings during use.

2. The heat sink system as defined in claim 1, wherein the heat sink comprises a curved section of metal, and wherein a portion of the curved section of metal is configured to press against the component during use.

3. The heat sink system as defined in claim 2, further comprising a thermal interface pad coupled to the curved section of metal, wherein the thermal interface pad thermally connects the component to the heat sink during use.

4. The heat sink system as defined in claim 1, wherein the component comprises a central processing unit.

5. The heat sink system as defined in claim 1, wherein the first fastener comprises a washer, and wherein the washer is configured to couple to a post extending through the heat sink.

6. The heat sink system as defined in claim 1, further comprising an interface component thermally connected to the component, wherein said heat sink thermally contacts the interface component, and wherein heat is transferred from the component to the interface component, from the interface component to the heat sink, and from the heat sink to the surroundings during use.

7. The heat sink system as defined in claim 6, wherein the interface component comprises a second heat sink.

8. The heat sink system as defined in claim 6, wherein the heat sink presses against the interface component during use to establish thermal connection between the heat sink and the computer component.

9. The heat sink system as defined in claim 1, wherein the heat sink presses against the component during use to establish thermal connection between the component and the heat sink.

10. The heat sink system as defined in claim 1, wherein the heat sink further comprises a corrugated portion, the corrugated portion configured to provide extended heat transfer surface area.

11. The heat sink system as defined in claim 1, wherein the heat sink further comprises finned protrusions, the finned protrusions configured to provide extended heat transfer surface area.

12. The heat sink system as defined in claim 1, further comprising a thermal interface pad, the thermal interface pad configured to be coupled to the heat sink for providing thermal conductivity between the component and the heat sink.

13. The heat sink system as defined in claim 12, wherein the thermal interface pad is compressible.

14. The heat sink system as defined in claim 1, wherein the heat sink is formed substantially of aluminum, an aluminum alloy, copper, or a copper alloy.

15. The heat sink system as defined in claim 14, wherein the heat sink comprises beryllium copper.

16. The heat sink system as defined in claim 1, wherein the enclosure comprises panels, and wherein the heat sink mounts to a panel.

17. A heat sink for a component within an enclosure, comprising:

- a heat transfer section having a thermal contact surface configured to thermally couple to the component during use, wherein the heat transfer section includes extended surface area portions;
- a first mount coupled to a first end of the thermal contact surface, the first mount configured to couple to the enclosure; and
- a second mount coupled to a second end of the thermal contact surface, the second mount configured to couple to the enclosure;
- wherein the thermal contact surface is located between the first mount and the second mount.

18. The heat sink as defined in claim 17, wherein a portion of the heat transfer section comprises a curved section of metal, the curved section of metal configured to press against the component to thermally connect the heat transfer section to the component during use.

19. The heat sink as defined in claim 17, further comprising a thermal interface pad coupled to the heat transfer section, the thermal interface pad configured to provide thermal conductivity between the computer component and the heat transfer section.

20. The heat sink as defined in claim 19, wherein the thermal interface pad is compressible.

21. The heat sink as defined in claim 17, wherein the extended surface area portions comprise corrugations.

22. The heat sink as defined in claim 17, wherein the extended surface area portions comprise a plurality of fins extending from a portion of the heat transfer section.

23. The heat sink as defined in claim 17, wherein the heat sink is made substantially of aluminum, an aluminum alloy, copper, or a copper alloy.

24. A method of attaching a heat sink to a component within an enclosure, the method comprising:

- coupling the heat sink to the enclosure with a first fastener, wherein the first fastener and the heat sink are configured to allow movement of a portion of the heat sink relative the enclosure;
- coupling the heat sink to the enclosure with a second fastener; and
- placing the enclosure about the component to bring the heat sink into thermal contact with the component between the first fastener and the second fastener.

25. The method as defined in claim 24 wherein the enclosure comprises a panel, and wherein coupling the heat sink to the enclosure with the first fastener comprises connecting the heat sink to the panel.

26. The method as defined in claim 24 further comprising coupling an interface component to the component, said interface component thermally contacts the component; and wherein placing the enclosure about the component to bring the heat sink into thermal contact with the component further comprises thermally contacting the interface component with the heat sink.

27. The method as defined in claim 26 wherein placing the enclosure about the component to bring the heat sink into thermal contact with the component presses the heat sink against the interface component.

28. The method as defined in claim 24 wherein placing the enclosure about the component to bring the heat sink into thermal contact with the component presses the heat sink against the component.

* * * * *